(12) United States Patent
Choi

(10) Patent No.: US 12,745,368 B2
(45) Date of Patent: Sep. 22, 2026

(54) SYSTEMS AND METHODS FOR AN INTERLOCKING FEATURE ON A POWER MODULE

(71) Applicant: BorgWarner US Technologies LLC, Wilmington, DE (US)

(72) Inventor: Edward Choi, Lake Orion, MI (US)

(73) Assignee: BorgWarner US Technologies LLC, Wilmington, DE (US)

( * ) Notice: Subject to any disclaimer, the term of this patent is extended or adjusted under 35 U.S.C. 154(b) by 464 days.

(21) Appl. No.: 18/159,427

(22) Filed: Jan. 25, 2023

(65) Prior Publication Data

US 2024/0105547 A1 Mar. 28, 2024

Related U.S. Application Data

(60) Provisional application No. 63/378,601, filed on Oct. 6, 2022, provisional application No. 63/377,512, filed (Continued)

(51) Int. Cl.
*H05K 7/20* (2006.01)
*H02M 1/00* (2006.01)

(Continued)

(52) U.S. Cl.
CPC ...... *H05K 7/20436* (2013.01); *H02M 1/0054* (2021.05); *H02M 1/327* (2021.05); *H05K 7/20154* (2013.01); *H05K 7/20854* (2013.01); *H05K 7/209* (2013.01); *H10W 40/037* (2026.01); *H10W 40/22* (2026.01); *H10W 40/611* (2026.01); *H10W 40/641* (2026.01);

(Continued)

(58) Field of Classification Search
None
See application file for complete search history.

(56) References Cited

U.S. PATENT DOCUMENTS 4,054,828 A 10/1977 Conzelmann et al.
4,128,801 A 12/1978 Gansert et al.

(Continued)

FOREIGN PATENT DOCUMENTS

EP 3751602 A1 12/2020
WO 2007093598 A1 8/2007

(Continued)

OTHER PUBLICATIONS

Balogh, L., "Fundamentals of Mosfet and IGBT Gate Driver Circuits," Texas Instruments Application Report, SLUA618-March (2017), Retrieved from internet URL: https://ghioni.faculty.polimi.it/pel/readmat/gate-drive.pdf, 65 pages.

(Continued)

*Primary Examiner* — Courtney L Smith
(74) *Attorney, Agent, or Firm* — Joshua M. Haines; Bookoff McAndrews, PLLC

(57) ABSTRACT

A system includes a power module, wherein the power module includes a first interlocking feature on a first surface of the power module; and at least one heat sink, wherein the at least one heat sink includes a second interlocking feature on a surface of the at least one heat sink, wherein the surface of the at least one heat sink includes a layer of thermal interface material.

16 Claims, 7 Drawing Sheets

Related U.S. Application Data on Sep. 28, 2022, provisional application No. 63/377,501, filed on Sep. 28, 2022, provisional application No. 63/377,486, filed on Sep. 28, 2022.

(51) Int. Cl.

| | |
|---|---|
| ***H02M 1/32*** | (2007.01) |
| ***H10W 40/00*** | (2026.01) |
| ***H10W 40/22*** | (2026.01) |
| ***H10W 40/60*** | (2026.01) |
| ***H10W 40/77*** | (2026.01) |
| ***H10W 70/40*** | (2026.01) |
| ***H10W 70/65*** | (2026.01) |
| ***H10W 90/00*** | (2026.01) |
| *B60L 3/00* | (2019.01) |
| *B60L 50/51* | (2019.01) |
| *B60L 53/20* | (2019.01) |
| *B60L 53/22* | (2019.01) |
| *B60R 16/02* | (2006.01) |
| *H02M 1/08* | (2006.01) |
| *H02M 1/42* | (2007.01) |
| *H02M 1/44* | (2007.01) |
| *H02M 7/00* | (2006.01) |
| *H02M 7/537* | (2006.01) |
| *H02M 7/5387* | (2007.01) |
| *H05K 1/14* | (2006.01) |
| *H05K 1/181* | (2026.01) |
| *H05K 1/182* | (2026.01) |
| *H05K 5/02* | (2006.01) |
| *H10D 64/01* | (2025.01) |
| *H10W 40/20* | (2026.01) |
| *H10W 72/00* | (2026.01) |

(52) U.S. Cl.

CPC ....... *H10W 40/778* (2026.01); *H10W 70/481* (2026.01); *H10W 70/65* (2026.01); *H10W 90/00* (2026.01); *B60L 3/003* (2013.01); *B60L 50/51* (2019.02); *B60L 53/20* (2019.02); *B60L 53/22* (2019.02); *B60R 16/02* (2013.01); *H02M 1/0009* (2021.05); *H02M 1/08* (2013.01); *H02M 1/32* (2013.01); *H02M 1/322* (2021.05); *H02M 1/4258* (2013.01); *H02M 1/44* (2013.01); *H02M 7/003* (2013.01); *H02M 7/537* (2013.01); *H02M 7/5387* (2013.01); *H05K 1/145* (2013.01); *H05K 1/181* (2013.01); *H05K 1/182* (2013.01); *H05K 5/0247* (2013.01); *H05K 7/2039* (2013.01); *H05K 2201/042* (2013.01); *H05K 2201/10166* (2013.01); *H10D 64/018* (2025.01); *H10W 40/226* (2026.01); *H10W 40/235* (2026.01); *H10W 40/60* (2026.01); *H10W 72/07331* (2026.01)

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,426,565 | A * | 6/1995 | Anderson ........... H01L 23/4006 257/E23.084 |
| 5,432,371 | A | 7/1995 | Denner et al. |
| 5,559,661 | A | 9/1996 | Meinders |
| 5,654,863 | A | 8/1997 | Davies |
| 5,764,007 | A | 6/1998 | Jones |
| 5,841,312 | A | 11/1998 | Mindl et al. |
| 6,028,470 | A | 2/2000 | Michel et al. |
| 6,163,138 | A | 12/2000 | Kohl et al. |
| 6,351,173 | B1 | 2/2002 | Ovens et al. |
| 6,426,857 | B1 | 7/2002 | Doster et al. |
| 6,597,556 | B1 | 7/2003 | Michel et al. |
| 6,757,170 | B2 | 6/2004 | Lee et al. |
| 6,812,553 | B2 | 11/2004 | Gerbsch et al. |
| 6,943,293 | B1 | 9/2005 | Jeter et al. |
| 7,095,098 | B2 | 8/2006 | Gerbsch et al. |
| 7,206,204 | B2 * | 4/2007 | Nakatsu ................ H01L 25/115 257/E25.026 |
| 7,229,855 | B2 | 6/2007 | Murphy |
| 7,295,433 | B2 | 11/2007 | Taylor et al. |
| 7,459,954 | B2 | 12/2008 | Kuehner et al. |
| 7,538,425 | B2 | 5/2009 | Myers et al. |
| 7,551,439 | B2 | 6/2009 | Peugh et al. |
| 7,616,047 | B2 | 11/2009 | Rees et al. |
| 7,679,182 | B2 | 3/2010 | Yoshinari et al. |
| 7,724,046 | B2 | 5/2010 | Wendt et al. |
| 7,750,720 | B2 | 7/2010 | Dittrich |
| 9,088,159 | B2 | 7/2015 | Peuser |
| 9,275,915 | B2 | 3/2016 | Heinisch et al. |
| 9,373,970 | B2 | 6/2016 | Feuerstack et al. |
| 9,431,932 | B2 | 8/2016 | Schmidt et al. |
| 9,515,584 | B2 | 12/2016 | Koller et al. |
| 9,548,675 | B2 | 1/2017 | Schoenknecht |
| 9,806,607 | B2 | 10/2017 | Ranmuthu et al. |
| 9,843,320 | B2 | 12/2017 | Richter et al. |
| 9,871,444 | B2 | 1/2018 | Ni et al. |
| 9,882,490 | B2 | 1/2018 | Veeramreddi et al. |
| 10,111,285 | B2 | 10/2018 | Shi et al. |
| 10,116,300 | B2 | 10/2018 | Blasco et al. |
| 10,204,872 | B2 | 2/2019 | Kobayashi et al. |
| 10,232,718 | B2 | 3/2019 | Trunk et al. |
| 10,270,354 | B1 | 4/2019 | Lu et al. |
| 10,291,225 | B2 | 5/2019 | Li et al. |
| 10,420,256 | B1 * | 9/2019 | Nakamura ......... H05K 7/20927 |
| 10,525,847 | B2 | 1/2020 | Strobel et al. |
| 10,797,579 | B2 | 10/2020 | Hashim et al. |
| 10,924,001 | B2 | 2/2021 | Li et al. |
| 10,932,396 | B2 * | 2/2021 | Song .................. H05K 7/20927 |
| 11,082,052 | B2 | 8/2021 | Jang et al. |
| 11,108,389 | B2 | 8/2021 | Li et al. |
| 11,342,911 | B2 | 5/2022 | Lee et al. |
| 11,838,011 | B2 | 12/2023 | Li et al. |
| 11,843,320 | B2 | 12/2023 | Sivakumar et al. |
| 11,848,426 | B2 | 12/2023 | Zhang et al. |
| 11,851,038 | B2 | 12/2023 | Solanki et al. |
| 11,855,522 | B2 | 12/2023 | Rudolph et al. |
| 11,855,630 | B2 | 12/2023 | Dake et al. |
| 11,870,338 | B1 | 1/2024 | Narayanasamy |
| 11,872,997 | B2 | 1/2024 | Hoos et al. |
| 11,881,859 | B2 | 1/2024 | Gupta et al. |
| 11,888,391 | B2 | 1/2024 | Balasubramanian et al. |
| 11,888,393 | B2 | 1/2024 | Venkateswaran et al. |
| 11,901,803 | B2 | 2/2024 | Ruck et al. |
| 11,901,881 | B1 | 2/2024 | Narayanasamy |
| 11,909,319 | B2 | 2/2024 | Esteghlal et al. |
| 11,916,426 | B2 | 2/2024 | Oner et al. |
| 11,923,762 | B2 | 3/2024 | Sethumadhavan et al. |
| 11,923,764 | B1 | 3/2024 | Zhang |
| 11,923,799 | B2 | 3/2024 | Ojha et al. |
| 11,925,119 | B2 | 3/2024 | Male et al. |
| 11,927,624 | B2 | 3/2024 | Patel et al. |
| 11,938,838 | B2 | 3/2024 | Simonis et al. |
| 11,942,927 | B2 | 3/2024 | Purcarea et al. |
| 11,942,934 | B2 | 3/2024 | Ritter |
| 11,945,331 | B2 | 4/2024 | Blemberg et al. |
| 11,945,522 | B2 | 4/2024 | Matsumura et al. |
| 11,949,320 | B2 | 4/2024 | Jaladanki et al. |
| 11,949,333 | B2 | 4/2024 | Pahkala et al. |
| 11,955,896 | B2 | 4/2024 | Liu et al. |
| 11,955,953 | B2 | 4/2024 | Sinn et al. |
| 11,955,964 | B2 | 4/2024 | Agarwal et al. |
| 11,962,234 | B2 | 4/2024 | Narayanasamy et al. |
| 11,962,291 | B2 | 4/2024 | Oberdieck et al. |
| 11,964,587 | B2 | 4/2024 | Yukawa |
| 11,970,076 | B2 | 4/2024 | Sarfert et al. |
| 11,977,404 | B2 | 5/2024 | Chandrasekaran |

(56) References Cited

U.S. PATENT DOCUMENTS 11,984,802 B2 5/2024 Merkin et al.
11,984,876 B2 5/2024 Neidorff et al.
11,990,776 B2 5/2024 Dulle
11,990,777 B2 5/2024 Woll et al.
11,996,686 B2 5/2024 Chan et al.
11,996,699 B2 5/2024 Vasconcelos Araujo et al.
11,996,714 B2 5/2024 El Markhi et al.
11,996,715 B2 5/2024 Nandi et al.
11,996,762 B2 5/2024 Hembach et al.
11,996,830 B2 5/2024 Murthy et al.
11,996,847 B1 5/2024 Kazama et al.
12,003,191 B2 6/2024 Chaudhary et al.
12,003,229 B2 6/2024 Kaya et al.
12,003,237 B2 6/2024 Waters
12,008,847 B2 6/2024 Braun et al.
12,009,679 B2 6/2024 Gottwald et al.
12,012,057 B2 6/2024 Schneider et al.
12,015,342 B2 6/2024 Kienzler et al.
12,019,112 B2 6/2024 Jarmolowitz et al.
12,021,517 B2 6/2024 S et al.
2004/0042178 A1 3/2004 Gektin et al.
2008/0174393 A1* 7/2008 Schnetzka ............... H02P 27/08 336/57
2008/0237847 A1* 10/2008 Nakanishi ................ F28F 3/12 257/722
2011/0222245 A1* 9/2011 George ................ H05K 5/0217 361/728
2012/0001341 A1* 1/2012 Ide ........................ H01L 25/117 257/773
2012/0287582 A1 11/2012 Vinciarelli et al.
2017/0263534 A1* 9/2017 Abeyasekera ...... H01L 25/0655
2017/0301633 A1* 10/2017 Kobayashi ............ H01L 23/051
2017/0331469 A1 11/2017 Kilb et al.
2020/0195121 A1 6/2020 Keskar et al.
2021/0005711 A1 1/2021 Martinez-Limia et al.
2021/0337703 A1* 10/2021 Lee ....................... H01L 23/473
2022/0052610 A1 2/2022 Plum
2022/0183182 A1* 6/2022 Nayak ................... H01L 23/473
2022/0294441 A1 9/2022 Purcarea et al.
2022/0301979 A1* 9/2022 Pavlicek ............. H01L 23/3737
2023/0010616 A1 1/2023 Gschwantner et al.
2023/0061922 A1 3/2023 Ritter
2023/0082076 A1 3/2023 Strache et al.
2023/0126070 A1 4/2023 Oberdieck et al.
2023/0179198 A1 6/2023 Winkler
2023/0231210 A1 7/2023 Joos et al.
2023/0231400 A1 7/2023 Oberdieck et al.
2023/0231496 A1 7/2023 Syed et al.
2023/0238808 A1 7/2023 Swoboda et al.
2023/0268251 A1* 8/2023 Chen .................... B23K 20/122 257/690
2023/0268826 A1 8/2023 Yan et al.
2023/0335509 A1 10/2023 Poddar
2023/0365086 A1 11/2023 Schumacher et al.
2023/0370062 A1 11/2023 Wolf
2023/0378022 A1 11/2023 Kim et al.
2023/0386963 A1 11/2023 Kim et al.
2023/0402930 A1 12/2023 Corry et al.
2023/0420968 A1 12/2023 Oner et al.
2023/0421049 A1 12/2023 Neidorff
2024/0006869 A1 1/2024 Kim et al.
2024/0006899 A1 1/2024 Wernerus
2024/0006993 A1 1/2024 Barjati et al.
2024/0022187 A1 1/2024 Fassnacht
2024/0022240 A1 1/2024 Balaz
2024/0022244 A1 1/2024 S et al.
2024/0030730 A1 1/2024 Wernerus
2024/0039062 A1 2/2024 Wernerus
2024/0039402 A1 2/2024 Bafna et al.
2024/0039406 A1 2/2024 Chen et al.
2024/0048048 A1 2/2024 Zhang
2024/0055488 A1 2/2024 Lee et al.
2024/0067116 A1 2/2024 Qiu
2024/0072675 A1 2/2024 Formenti et al.
2024/0072817 A1 2/2024 K et al.
2024/0077899 A1 3/2024 Chitnis et al.
2024/0078204 A1 3/2024 Roehrle et al.
2024/0079950 A1 3/2024 Narayanasamy
2024/0079958 A1 3/2024 Kumar et al.
2024/0080028 A1 3/2024 Dake et al.
2024/0088647 A1 3/2024 Ramadass et al.
2024/0088896 A1 3/2024 Bilhan et al.
2024/0097437 A1 3/2024 Goyal et al.
2024/0097459 A1 3/2024 Swoboda et al.
2024/0105276 A1 3/2024 Duryea
2024/0106248 A1 3/2024 Woll et al.
2024/0106435 A1 3/2024 Zhang et al.
2024/0113517 A1 4/2024 Sriraj et al.
2024/0113611 A1 4/2024 Kaufmann et al.
2024/0113620 A1 4/2024 Ranmuthu et al.
2024/0113624 A1 4/2024 Southard et al.
2024/0120558 A1 4/2024 Zhang et al.
2024/0120765 A1 4/2024 Oner et al.
2024/0120962 A1 4/2024 Miriyala et al.
2024/0121924 A1* 4/2024 Ryu ...................... B29C 66/322
2024/0128851 A1 4/2024 Ruck et al.
2024/0128859 A1 4/2024 Chen
2024/0128867 A1 4/2024 Wang et al.
2024/0146177 A1 5/2024 Mehdi et al.
2024/0146306 A1 5/2024 Ramkaj et al.
2024/0149734 A1 5/2024 Eisenlauer
2024/0162723 A1 5/2024 Zipf et al.
2024/0178756 A1 5/2024 El-Markhi et al.
2024/0178824 A1 5/2024 Kazama et al.
2024/0186803 A1 6/2024 Krieg et al.
2024/0198937 A1 6/2024 Benqassmi et al.
2024/0198938 A1 6/2024 Carlos et al.
2024/0204540 A1 6/2024 Majmunovic et al.
2024/0204541 A1 6/2024 Majmunovic et al.
2024/0204671 A1 6/2024 Liu et al.
2024/0204765 A1 6/2024 Dake
2024/0213874 A1 6/2024 Junnarkar et al.
2024/0213971 A1 6/2024 Lee
2024/0213975 A1 6/2024 Narayanasamy
2024/0213981 A1 6/2024 Agarwal et al.

FOREIGN PATENT DOCUMENTS

WO 2019034505 A1 2/2019
WO 2020156820 A1 8/2020
WO 2020239797 A1 12/2020
WO 2021110405 A1 6/2021
WO 2021213728 A1 10/2021
WO 2022012943 A1 1/2022
WO 2022229149 A1 11/2022
WO 2023006491 A1 2/2023
WO 2023046607 A1 3/2023
WO 2023094053 A1 6/2023
WO 2023110991 A1 6/2023
WO 2023147907 A1 8/2023
WO 2023151850 A1 8/2023
WO 2023227278 A1 11/2023
WO 2023237248 A1 12/2023
WO 2024006181 A2 1/2024
WO 2024012743 A1 1/2024
WO 2024012744 A1 1/2024
WO 2024022219 A1 2/2024
WO 2024041776 A1 2/2024
WO 2024046614 A1 3/2024
WO 2024049730 A1 3/2024
WO 2024049884 A1 3/2024
WO 2024049909 A1 3/2024
WO 2024056388 A1 3/2024
WO 2024068065 A1 4/2024
WO 2024068076 A1 4/2024
WO 2024068113 A1 4/2024
WO 2024068115 A1 4/2024
WO 2024083391 A1 4/2024
WO 2024093384 A1 5/2024
WO 2024104970 A1 5/2024
WO 2024108401 A1 5/2024
WO 2024110106 A1 5/2024
WO 2024110265 A1 5/2024

(56) References Cited

FOREIGN PATENT DOCUMENTS

| | | | |
|---|---|---|---|
| WO | 2024110297 | A1 | 5/2024 |
| WO | 2024114978 | A1 | 6/2024 |
| WO | 2024114979 | A1 | 6/2024 |
| WO | 2024114980 | A1 | 6/2024 |
| WO | 2024128286 | A1 | 6/2024 |
| WO | 2024132249 | A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034. pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/IEEE/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

* cited by examiner

SYSTEMS AND METHODS FOR AN INTERLOCKING FEATURE ON A POWER MODULE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to power modules, and more specifically, to systems and methods for providing Bond-Line-Thickness (BLT) control and an interlocking feature on a power module to, e.g., facilitate aligning the power module with one or more heat sinks during an assembly process.

INTRODUCTION

The power module is one of the key components in a traction inverter for controlling performance and/or efficiency of a driving system. A critical aspect for performance and reliability stems from the correct Bond-Line-Thickness Control of TIM (Thermal-Interface-Material) and from the correct placement of the power module on the heat sink in a manner that creates a strong bonding integrity between the power module and heat sink.

SUMMARY OF THE DISCLOSURE

In some aspects, the techniques described herein relate to a system including: a power module, wherein the power module includes a first interlocking feature on a first surface of the power module; and at least one heat sink, wherein the at least one heat sink includes a second interlocking feature on a surface of the at least one heat sink, wherein the surface of the at least one heat sink includes a layer of thermal interface material.

In some aspects, the techniques described herein relate to a system, wherein the power module includes the first interlocking feature on a second surface of the power module, wherein the second surface is separated from the first surface by a width of the power module.

In some aspects, the techniques described herein relate to a system, wherein the first interlocking feature is a protruding interlocking feature.

In some aspects, the techniques described herein relate to a system, wherein the second interlocking feature is a recessed interlocking feature.

In some aspects, the techniques described herein relate to a system, wherein the recessed interlocking feature is a blind cavity.

In some aspects, the techniques described herein relate to a system, wherein the layer of thermal interface material includes thermal tapes, gels, thermal epoxies, solders, greases, gap-filled pads, and phase change materials.

In some aspects, the techniques described herein relate to a system, wherein the first surface and second surface include an epoxy mold compound or a copper layer.

In some aspects, the techniques described herein relate to a system, wherein the first interlocking feature is located on either the epoxy mold compound or the copper layer.

In some aspects, the techniques described herein relate to a system, wherein the at least one heat sink includes an inlet port or an outlet port.

In some aspects, the techniques described herein relate to a system, wherein the layer of thermal interface material is uniformly extended across the surface between the recessed interlocking features of the at least one heat sink.

In some aspects, the techniques described herein relate to a method for aligning a power module and a heat sink, the method including: forming a first interlocking feature on a surface of a power module; forming a second interlocking feature on a surface of a heat sink; applying a layer of thermal interface material on the surface of the heat sink or power module; and mating the first interlocking feature with the second interlocking feature.

In some aspects, the techniques described herein relate to a method, wherein forming the second interlocking feature includes machining or laser drilling into the surface of the heat sink.

In some aspects, the techniques described herein relate to a method, wherein the first interlocking feature is a protruding interlocking feature.

In some aspects, the techniques described herein relate to a method, wherein the second interlocking feature is a recessed interlocking feature.

In some aspects, the techniques described herein relate to a method, wherein the layer of thermal interface material is applied uniformly to the surface between the recessed interlocking feature of the heat sink.

In some aspects, the techniques described herein relate to a method, further including: conducting finite element analysis to determine ideal locations for both the first interlocking feature and second interlocking feature.

In some aspects, the techniques described herein relate to a method, wherein applying the layer of thermal interface material includes using solder paste, silver sinter paste, or a pump to dispense the layer of thermal interface material onto the surface of the heat sink or power module.

In some aspects, the techniques described herein relate to a method, wherein applying the layer of thermal interface material includes any suitable pattern such as a dot, serpentine, or spiral.

In some aspects, the techniques described herein relate to a method, further including: aligning the heat sink with the power module.

In some aspects, the techniques described herein relate to a method, wherein the heat sink and power module are aligned by a deformable washer or spring clamp.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Both the foregoing general description and the following detailed description are exemplary and explanatory only and are not restrictive of the features, as claimed. As used herein, the terms “comprises,” “comprising,” “has,” “having,” “includes,” “including,” or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, “about,” “substantially,” and “approximately” are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the power module may be described as a device, but may refer to any device for controlling the flow of power in an electrical circuit. For example, a power module may be a metal-oxide-semiconductor field-effect transistor (MOSFETs), bipolar junction transistor (BJTs), insulated-gate bipolar transistor (IGBTs), or relays, for example, or any combination thereof, but are not limited thereto.

An interlocking feature, as described herein, on a power module and/or heat sink may eliminate the tools required, during packaging assembly, for ensuring the correct placement of a power module on a heat sink. In addition, the interlocking feature may provide for an increase in the strength of bonding integrity between a power module and a heat sink. The increase in strength provided by the interlocking feature may reduce failure or cracking on a power module by creating strong interlocking bonding and tight control of bond line thickness.

Figure 1:
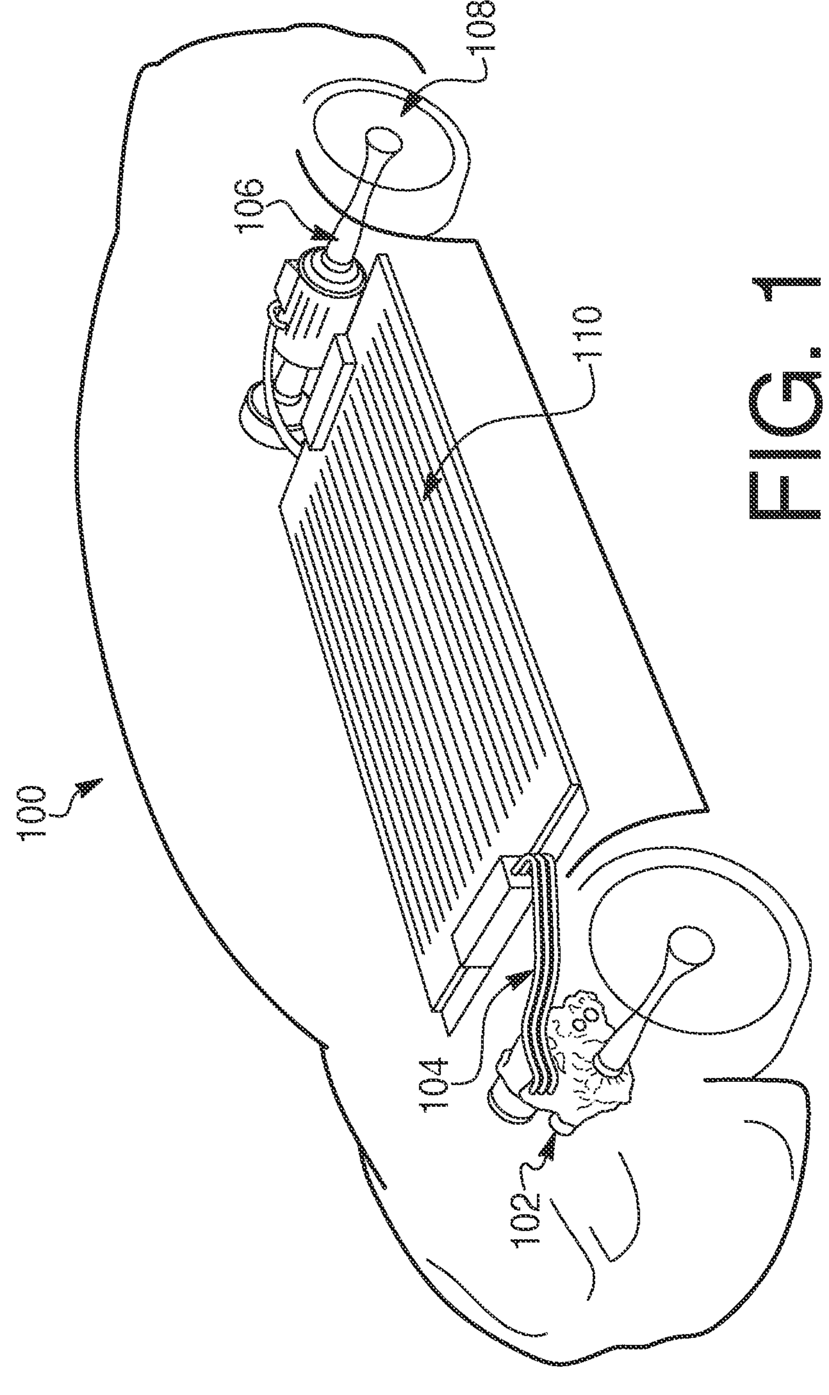
FIG. 1 depicts an exemplary system infrastructure for a vehicle including a traction inverter, according to one or more embodiments.

Turning now to FIG. 1, there is depicted an exemplary system infrastructure for a vehicle including traction inverter 102, according to one or more embodiments of the present disclosure. Electric vehicle 100 may include traction inverter 102, drive motor 106, battery 110, and connectors 104 connecting the inverter 102 and battery 110. Traction inverter 102 may include components to receive electrical power from an external source and output electrical power to charge battery 110 of electric vehicle 100. Traction inverter 102, through the use of a power module, may convert DC power from battery 110 in electric vehicle 100 to AC power, to power motor 106 and wheels 108 of electric vehicle 100, for example, but the embodiments are not limited thereto. The power module may be bidirectional, and may convert DC power to AC power, or convert AC power to DC power, such as during regenerative braking, for example. Traction inverter 102 may be a three-phase inverter, a single-phase inverter, or a multi-phase inverter.

Figure 2A:
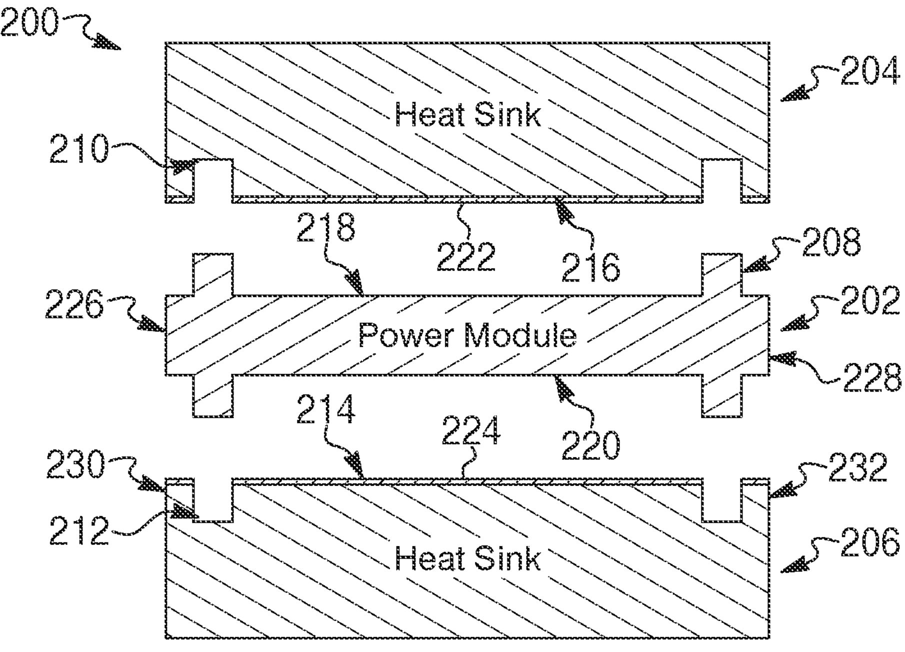
FIG. 2A and FIG. 2B depict a side view of an exemplary system of interlocking features on a power module and heat sinks, according to embodiments of the present disclosure.
Figure 2B:
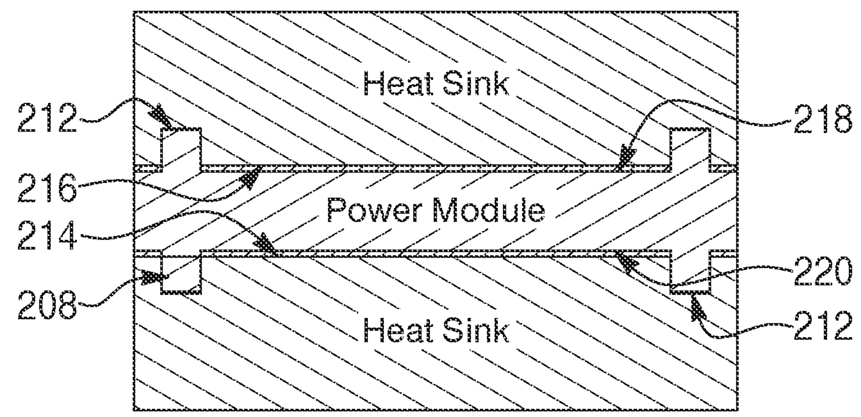

FIGS. 2A and 2B depict a side view of system 200, which may include power module 202, first heat sink 204, second heat sink 206, protruding interlocking features 208, recessed interlocking features 210 and 212, and thermal interface materials 222 and 224. System 200 may include power module 202 where first heat sink 204 may be located above first surface 218 (e.g., a top surface 218) of power module 202 and second heat sink 206 may be located beneath second surface 220 (e.g., a bottom surface 220) of power module 202. The power module 202 may include a plurality of protruding interlocking features 208. Protruding interlocking features 208 may include any suitable shape, geometry and configuration. For example, in some embodiments, protruding interlocking features 208 may actually be replaced with recesses configured to receive corresponding mating protrusions on heat sinks 204, 206. As shown in FIG. 2A, however, in one embodiment, protruding interlocking features 208 include a plurality of protrusions on top surface 218 where the protruding interlocking features 208 include of extensions of top surface 218. Power module 202 may also include a plurality of protruding interlocking features 208 on bottom surface 220 of power module 202 where protruding interlocking features 208 include of extensions of bottom surface 220.

Figure 3A:
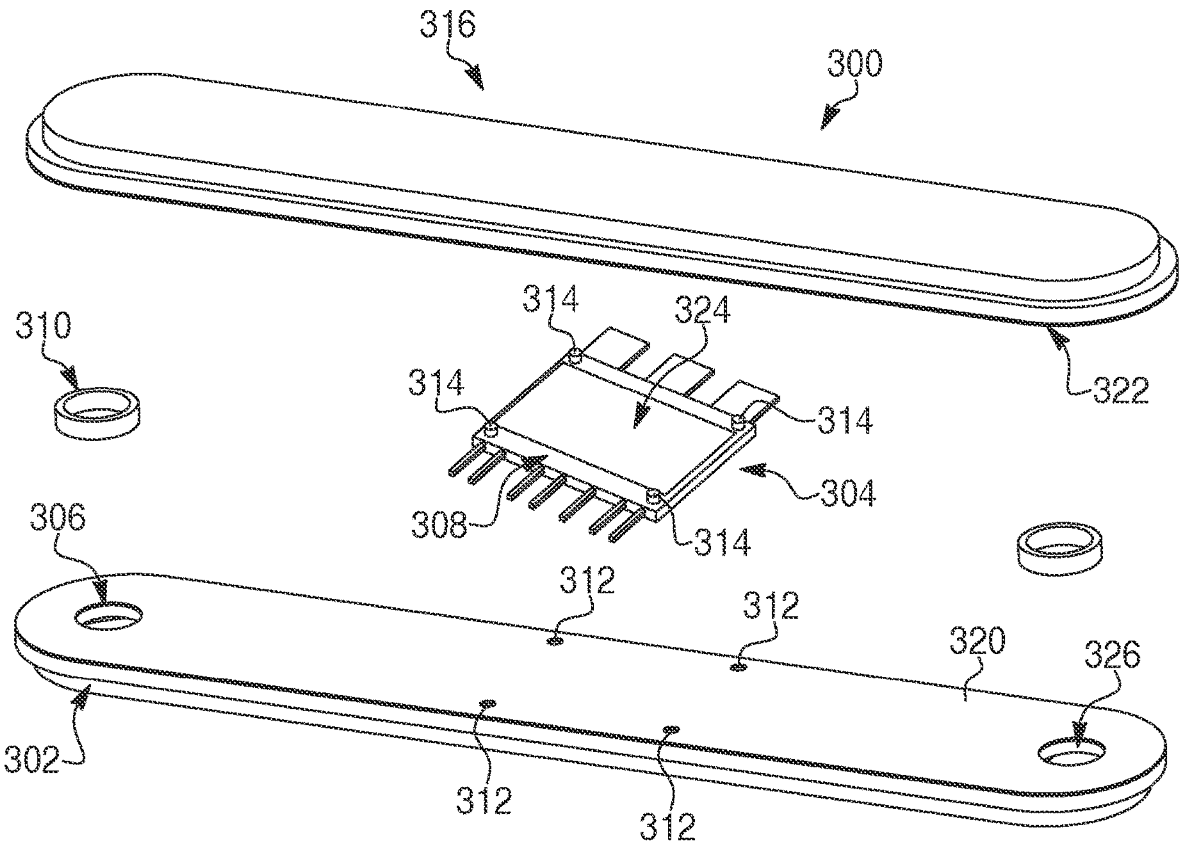
FIG. 3A and FIG. 3B depict another embodiment of the exemplary system of interlocking features on a power module and heat sinks.

The protruding interlocking features 208 may include any suitable size, shape, or configuration. Moreover, though FIG. 2A depicts only two protruding interlocking features 208 on each of top surface 218 and bottom surface 220, those of ordinary skill in the art will understand that any suitable number of protruding interlocking features 208 are within the scope of the embodiments described herein. Indeed, as shown in FIG. 3A, alternative embodiments may include, e.g., four protruding interlocking features, as described in detail below. Still further, the number, size, or configuration of the protruding interlocking features 208 on top surface 218 may be the same as, or differ in one more aspects from, the protruding interlocking features 208 on bottom surface 220. Furthermore, one or more of the protruding interlocking features 208 may include any suitable material known in the art, including, but not limited to, copper, aluminum, or an alloy of copper and aluminum. Each of the protruding interlocking features 208 may be made of the same material composition, or one or more interlocking features 208 may include a material composition that differs from the material composition other protruding interlocking features 208.

In another implementation, only one side of power module 202 may include a plurality of protruding interlocking features 208. For instance, the top surface 218 of the power module may comprise of a plurality of protruding interlocking features 208 but bottom surface 220 of power module 202 may include a flat surface.

The plurality of protruding interlocking features 208 may all be located at an equal distance from the edges of power module 202. For example, one of the plurality of protruding interlocking features 208 may be located, e.g., approximately 2 mm from first edge 226 of power module and one of the other plurality of protruding interlocking features 208 may be located, e.g., approximately 2 mm from a second edge 228 of power module 202. In another implementation, the location of protruding interlocking features 208 from first edge 226 and second edge 228 of the power module 202 may differ in comparison to each other. For instance, one of the plurality of protruding interlocking features 208 may be located, e.g., approximately 3 mm from first edge 226 of power module 202 while one of the other protruding interlocking features 208 may be located, e.g., approximately 5 mm from second edge 228 of power module 202.

Power module 202 may include, e.g., an approximately 800-Volt Silicon Carbide Inverter (e.g., for electrified vehicles), although other suitable structures and uses also are contemplated. Power module 202 may include one or more silicon carbide (SiC)-based power modules that deliver relatively high power densities and efficiencies needed to extend battery range and performance. Power module 202 may contain circuitry and components configured to convert direct current (DC) from the electric vehicle battery to alternating current (AC) current, which can be utilized within the electric motor that drives the propulsion system. Power module 202 may be installed on one or more power board assemblies. Power module 202 may include a combination of transistors, diodes, metal oxide semiconductor field effect transistors (MOSFETs), insulated-gate bipolar transistors (IGBTs), and silicon-controlled rectifiers (SCRs). Power module 202 may include a combination of transistors configured to both a half-bridge and H-bridge configuration, which may allow for the switch ability of the direction of the current through a motor from a single voltage power supply. Additionally, Power module 202 may also include up to six transistors for inverting applications such as switching direct current electricity into alternating current.

First heat sink 204 may include a plurality of recessed interlocking features 210 on surface 216, where the recessed interlocking features 210 include a blind cavity in surface 216. Second heat sink 206 may also include a plurality of recessed interlocking features 212 on surface 214, where the recessed interlocking features include a blind cavity in surface 214.

Recessed interlocking features 210 and 212 may include any suitable size, shape, or configuration. Moreover, though FIG. 2A depicts only two recessed interlocking features 210 and 212 on each of surface 216 of first heat sink 204 and surface 214 of second heat sink 206, those of ordinary skill in the art will understand that any suitable number of recessed interlocking features 210 and 212 are within the scope of the embodiments described herein. Indeed, as shown in FIG. 3A, alternative embodiments may include, e.g., four recessed interlocking features, as described in detail below. Still further, the number, size, or configuration of the recessed interlocking features 210 on surface 216 may be the same as, or differ in one more aspects from, the recessed interlocking features 212 on surface 214.

The plurality of recessed interlocking features 210 and 212 may all be located at an equal distance from the edges of either first heat sink 204 or second heat sink 206. For example, one of the plurality of recessed interlocking features 210 may be located, e.g., approximately 2 mm from a first edge 230 of first heat sink 204 and one of the other plurality of recessed interlocking features 210 may be located, e.g., approximately 2 mm from a second edge 232 of first heat sink 204. In another implementation, the location of recessed interlocking features 210 and 212 from the edges of either first heat sink 204 and second heat sink 206 may differ between each other. For instance, one of the plurality of recessed interlocking features 210 may be, e.g., approximately 3 mm from first edge 230 of first heat sink 204 while one or more of the other plurality of recessed interlocking features 210 may be, e.g., approximately 5 mm from second edge 232 of heat sink 204.

The recessed interlocking features 210 and 212 and protruding interlocking features 208, when engaged, may produce a force that more uniformly spreads the TIM layer (discussed in greater detail below) on first and second heat sinks 204 and 206 which in turn may reduce the bond line thickness. In some examples, the entirety of the applied TIM layer may be within 15%, 10%, 5%, 3%, 2%, 1% or less of a median thickness. Moreover, the entirety of the outer surfaces of all power modules (except for exposed electrical connections) may be covered with TIM. The reduction in bond line thickness may relieve pressure on power module 202, which may reduce the risk of cracks and failure of the power module structure.

Surface 216 of first heat sink 204 and surface 216 of second heat sink 206 may include a layer of thermal interface material (TIM) 222 and 224, respectively, to further aid thermal conduction between first heat sink 204 and power module 202 as well as between second heat sink 206 and power module 202. TIM layers 222 and 224 may include any suitable thermal tapes, gels, thermal epoxies, solders, greases, gap-filled pads, phase change materials, or combinations thereof.

TIM layers 222 and 224 on either surface 214 or 216 may include TIM extending across a substantial entirety, or across only a portion, of either surface 214 and 216. Additionally, TIM layers 222 and 224 may include TIM across a portion of surface 214 and 216 between recessed interlocked features 210 and 212. The amount of TIM extending across surface 214 may be the same as, or differ in one more aspects from, the amount of TIM extending across surface 216. Furthermore, TIM layers 222 and 224 may include any suitable material known in the art, including, but not limited to, silicone elastomer, fiberglass, or combination thereof. Surface 214 may include TIM layer 222 which may be made of the same material composition as TIM layer 224 included on surface 216, or TIM layer 222 may include a material composition that differs from the material composition of TIM layer 224.

TIM layers 222 and 224 may be uniformly composed of the same material. In another implementation, TIM layers 222 and 224 be a composite of different materials. For example, TIM layers 222 and 224 may include a combination of a gel and a grease. In another implementation, for example, TIM layers 222 and 224 disposed in the blind cavity of recessed interlocking features 210 and 212 may be composed of a different material from the TIM layers 222 and 224 included on surfaces 214 and 216.

First heat sink 204 and second heat sink 206 may provide a thermal heat dissipation for power module 202. Heat sinks 204 and 206 may include multiple components. The material of heat sink 204 and 206 may be selected based on the required thermal performance needed to draw heat away from power module 202. For example, heat sinks 204 and 206 may be include an aluminum alloy having a high thermal conductivity while being mechanically soft. In another embodiment, heat sinks 204 and 206 may be include copper. In some embodiments, heat sinks 204 and 206 may be similar to a radiator used in an internal combustion engine and may include a circulating fluid or gas therein. Heat sinks 204 and 206 may be in an extruded, folded fin, bonded fin, active fan, stamping, or cross-cut configuration.

As shown in FIG. 2B, the plurality of protruding interlocking features 208 on top surface 218 of power module 202 may be mated with the plurality of recessed interlocking features 210 of first heat sink 204. Additionally, the plurality of protruding interlocking features 208 on bottom surface 220 of power module 202 may be mated with the plurality of recessed interlocking features 212 of second heat sink 206. The plurality of recessed interlocking features 210 and 212 may be wider than the plurality of protruding interlocking features 208 of power module 202 such that a substantial entirety of protruding interlocking features 208 are received therein. A lubricating material may be included on top of TIM layers 222 and 224 in order to facilitate mating of protruding interlocking features 208 with recessed interlocking features 210 and 212. Top surface 218 and bottom surface 220 of the power module 202 may include an adhesive material (not shown) to keep heat sinks 204 and 206 mated with power module 202 when large amounts of heat is generated by power module 202.

Figure 3B:
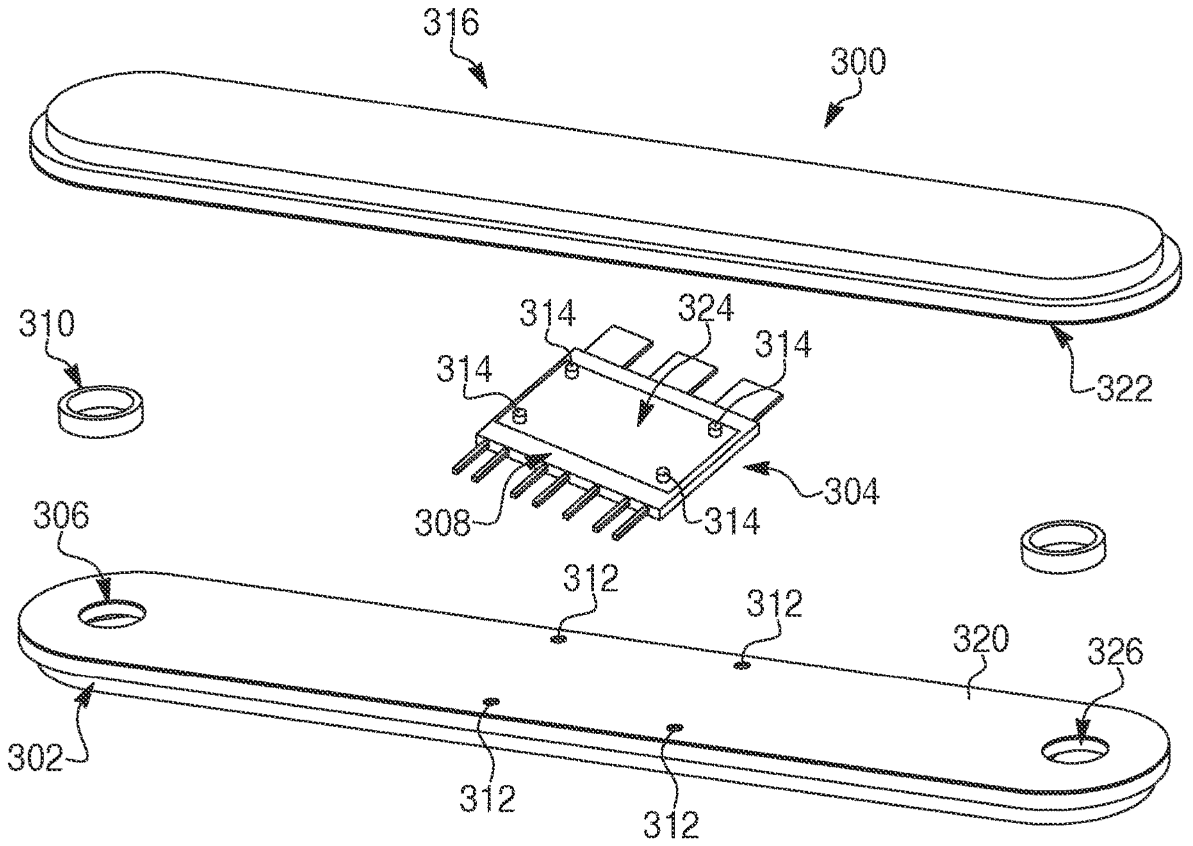

FIG. 3A and FIG. 3B depict another embodiment system 300. In the embodiment of system 300, protruding interlocking features 314 on power module 304 may be located on an epoxy mold compound 308 (as shown in FIG. 3A) or a copper layer 324 (as shown in FIG. 3B). Protruding interlocking features 314 may be located on any area of the epoxy mold compound 308 or copper layer 324 as long as the protruding interlocking features 314 align with corresponding recessed interlocking features 312 located on heat sinks 302 and 316. In both FIGS. 3A and 3B, the TIM layers 322 on both heat sinks 302 and 316 may include TIM extending across a substantial entirety or across only a portion of the surfaces of heat sinks 302 and 316. In another embodiment, TIM may only be included in the area in which the power module 304 will mate with heatsinks 302 and 316.

Heat sinks 302 and 316 may include integral fluid conducting micro-channels used for liquid cooling. In particular, heat sinks 302 and 316 may comprise one or more inlet ports 306 for supplying liquid coolants within the respective heat sink and one or more outlet ports 326 for exhausting coolant that has passed through the fluid conducting micro-channels. Heat sinks 302 and 316 may also include a fluid seal 310 to fluidly seal the inlet port 306 and outlet port 326. The fluid conducting micro-channels coupled with TIM layers may allow for more efficient cooling of the power module.

Figure 4A:
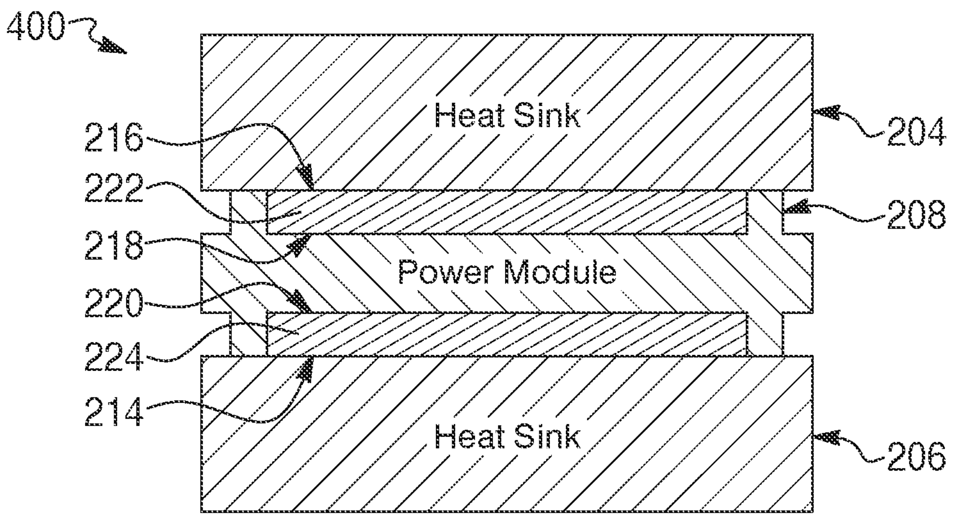
FIG. 4A and FIG. 4B depict another embodiment of the exemplary system of interlocking features on a power module and heat sinks.
Figure 4B:
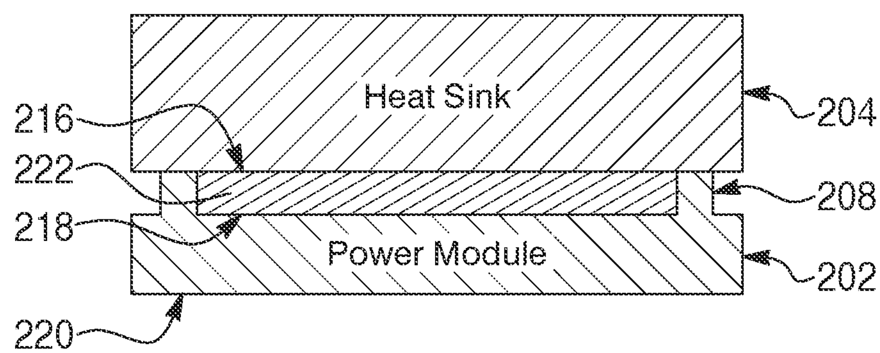

FIG. 4A and FIG. 4B depict another exemplary embodiment system 400 which is similar to the embodiment system 200 (as shown in FIGS. 2A and 2B). However, system 400 differs from system 200 in that surface 216 of first heat sink 204 and surface 214 of second heat sink 206 do not include a plurality of recessed interlocking features (as shown in FIG. 4A). Surface 216 of first heat sink 204 and surface 214 of second heat 206 may be a substantially, flat, or otherwise continuous surface.

The plurality of protruding interlocking features 208 on top surface 218 of power module 202 may be in contact with surface 216 of first heat sink 204 where a gap is formed between surface 216 and top surface 218. Additionally, the plurality of protruding interlocking features 208 on bottom surface 220 of power module 202 may be in contact with surface 214 of second heat sink 206 where a gap is formed between surface 214 and bottom surface 220. The gap formed between the heat sink 204 and 206 and power module 202 may be uniform. In another implementation, the height of the plurality of protruding interlocking features 208 on top surface 218 may differ than the height of the plurality of protruding interlocking on the bottom surface 220. Therefore, the height of the gap formed when the protruding interlocking features 208 on top surface 218 is in contact with surface 216 of first heat sink 204 may differ from the height of the gap formed when the protruding interlocking features 208 on bottom surface 220 is in contact with surface 214 of second heat sink 206.

TIM layers 222 and 224 on either surface 214 or 216 may include TIM extending across a substantial entirety, or across a portion of an area in which the power module does not mate with heat sinks 204 and 206. Moreover, the thickness of TIM layers 222 and 224 may fill the entire gap formed between the surfaces of the heat sink and power module. In another implementation, the amount of TIM filling the gap between top surface 218 and surface 216 of first heat sink 204 may be the same as, or differ in one or more aspects from, the amount of TIM filling the gap between bottom surface 220 and surface 214 of second heat sink 206.

In another embodiment, as shown in FIG. 4B, system 400 may include a power module 202 and a single heat sink 204 (or 206). The plurality of protruding interlocking features 208 may only be included on a single surface (top surface 218 or bottom surface 220) of power module 202 while the other surface (top surface 218 or bottom surface 220) may be a flat or otherwise free surface. The single heat sink 204 (or 206) may not include a plurality of recessed interlocking features 210 (or 212). Surface 218 (or 220) includes the plurality of protruding interlocking features 208 on power module 202 may be brought into proximity of or in contact with surface 216 (or 214) of the single heat sink 204 or 206 such that a gap is formed between surface 216 (or 214) of heat sink 204 or 206 and surface 218 (or 220) of power module 202. TIM layer 222 (or 224) may uniformly fill the gap between surface 216 (or 214) of heat sink 204 (or 206) and surface 218 (or 220) of power module 202. Furthermore, TIM layer 222 (or 224) on surface 216 (or 214) of the single heat sink 204 (or 206) may include TIM extending across an substantial entirety, or across a portion of an area in which the power module may not be in contact with the single heat sink 204 (or 206).

Figure 5A:
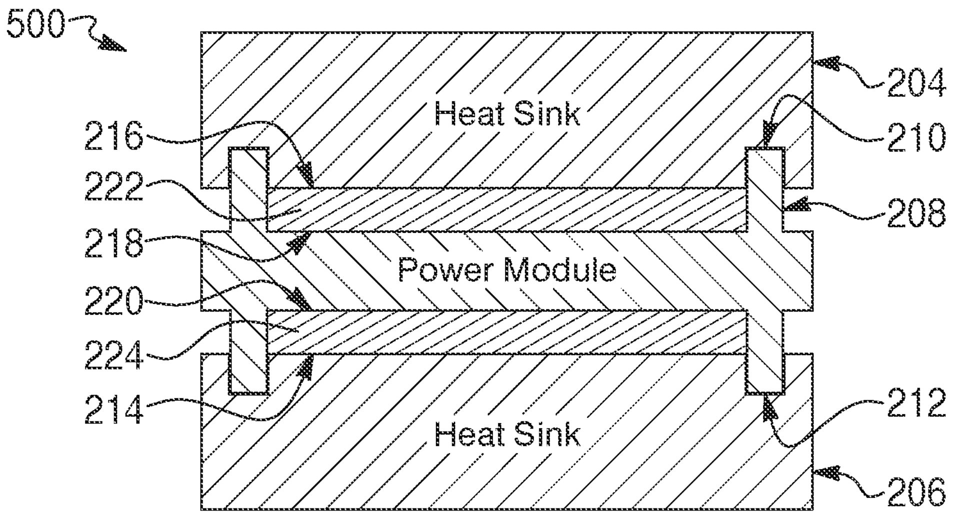
FIG. 5A and FIG. 5B depict another embodiment of the exemplary system of interlocking features on a power module and heat sinks.
Figure 5B:
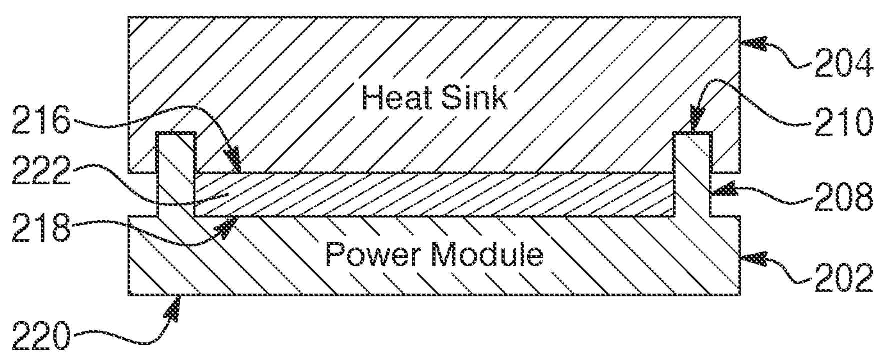

FIG. 5A and FIG. 5B depict another embodiment system 500 which is similar to embodiment system 200 (as shown in FIGS. 2A and 2B). However, system 500 differs from system 200, as shown in FIG. 5A, in that the height of the plurality of protruding interlocking features 208 on top surface 218 may be greater than the depth of the plurality of recessed interlocking features 210 on surface 216 of first heat sink 204. Additionally, the height of the plurality of protruding interlocking features 208 on bottom surface 220 of power module 202 may be greater than the depth of the plurality of recessed interlocking features 212 on surface 214 of second heat sink 206.

The plurality of protruding interlocking features 208 on top surface 218 of power module 202 may be mated with the plurality of recessed interlocking features 210 of first heat sink 204 such that a gap is formed between surface 216 and top surface 218. Additionally, the plurality of protruding interlocking features 208 on bottom surface 220 of power module 202 may be mated with the plurality of recessed interlocking features 212 of second heat sink 206 such that a gap is formed between surface 214 and bottom surface 220. The gap formed between the heat sink 204 and 206 and power module 202 may be uniform. In another implementation, the height of the plurality of protruding interlocking features 208 on the top surface 218 may differ than the height of the plurality of protruding interlocking on the bottom surface 220. Therefore, the height of the gap formed when the protruding interlocking features 208 on top surface 218 are mated to the plurality of recessed interlocking features 210 of first heat sink 204 may differ from the height of the gap formed when the protruding interlocking features 208 on bottom surface 220 are mated to the plurality of recessed interlocking features 212 of second heat sink 206.

TIM layers 222 and 224 on either surface 214 or 216 may include TIM extending across a substantial entirety, or across a portion of an area in which power module 202 does not make contact with heat sinks 204 and 206. Moreover, the thickness of TIM layers 222 and 224 may fill the entire gap formed between the surface of the heat sink and power module. In another implementation, the amount of TIM filling the gap between top surface 218 and surface 216 of first heat sink 204 may be the same as, or differ in one or more aspects from, the amount of TIM filling the gap between bottom surface 220 and surface 214 of second heat sink 206.

In another embodiment, as shown in FIG. 5B, system 500 may include a power module 202 and a single heat sink 204 (or 206). The plurality of protruding interlocking features 208 may only be included on a single surface (top surface 218 or bottom surface 220) of power module 202 while the other surface (top surface 218 or bottom surface 220) may be a flat, free surface. The single heat sink 204 (or 206) may include a plurality of recessed interlocking features 210 (or 212) which may have a depth that is less than the height of the plurality of protruding interlocking features 208. The plurality of protruding interlocking features 208 on power module 202 may be received within a plurality of recessed interlocking features of heat sink 204 (or 206) such that a gap is formed between surface 216 (or 214) of heat sink 204 (or 206) and surface 218 (or 220) of power module 202. TIM layer 222 (or 224) may uniformly fill the gap between surface 216 (or 214) of heat sink 204 (or 206) and surface 218 (or 220) of power module 202. Furthermore, TIM layer 222 (or 224) on surface 216 (or 214) of heat sink 204 (or 206) may include TIM extending across a substantial entirety, or across a portion of an area in which the power module does not mate with the single heat sink 204 (or 206).

Figure 6:
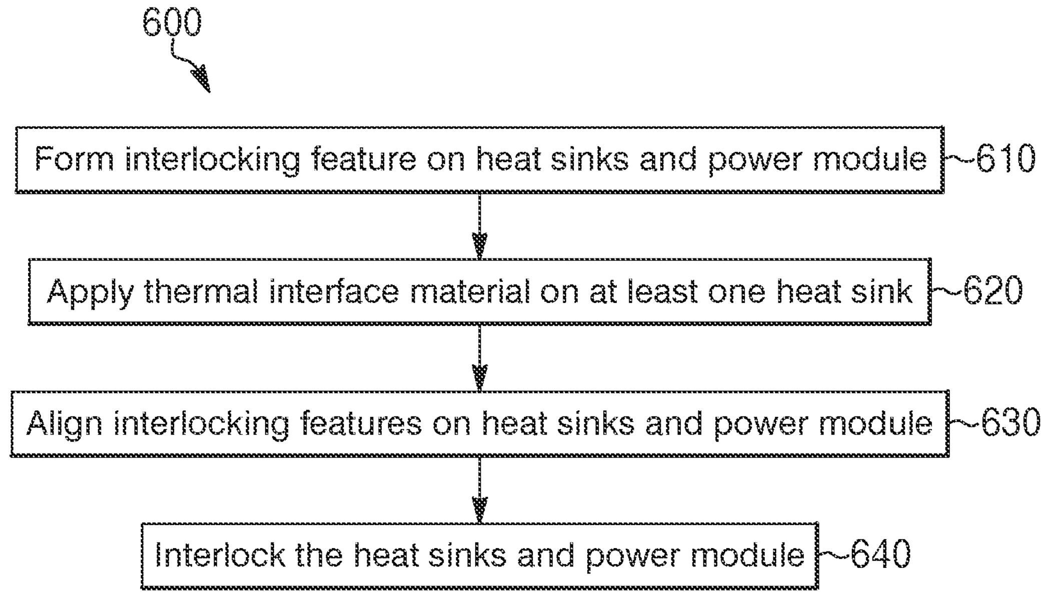
FIG. 6 depicts an exemplary method for aligning interlocking features on a heat sink to interlocking features on a power module.

FIG. 6 depicts an exemplary method 600 for aligning a heat sink to a power module. As shown in FIG. 6, a method 600 may include, at step 610, forming one or more interlocking features on heat sinks 204, 206 and power module 202. For example, slabs of copper may be soldered to external surface of power module 202 to create protruding interlocking features 208. Correspondingly recessed interlocking features 210, 212 may be machined or laser drilled into surfaces 214, 216 of heat sinks 204, 206. Moreover, any suitable analyses, e.g., finite element analysis, may be performed to determine ideal locations for both protruding interlocking features 208 and recessed interlocking features 210, 212.

Once protruding interlocking features 208 and recessed interlocking features 210 and 212 have been formed on power module 202 and heat sinks 204, 206 respectively, thermal interface material 222, 224 may be applied to surfaces of heat sinks 204, 206 or surfaces 218, 220 of power module 202 at step 620. For example, solder paste, silver sinter paste, or a pump may be used to dispense the TIM material on to at least one heat sink 204, 206 or power module 202. In one example, the pump may be a piston pump which may create little to no friction during dispensing of the TIM. In other examples, the pump may be a screw pump for dispensing the TIM. The TIM may be dispensed or otherwise deposited onto heat sinks 204, 206 or power module 202 in any suitable pattern, including, but not limited to, such as a dot, serpentine, or spiral.

Once the TIM has been dispensed on heat sinks 204, 206, protruding interlocking features 208 may be aligned with recessed interlocking features 210 and 212. Subsequently, the protruding interlocking features 208 may be mated (e.g., inserted into) with recessed interlocking features 210, and 212, thereby aligning the one more heat sinks 204, 206 with power module 202 at step 630. Heat sinks 204, 206 and power module 202 may be aligned with one another with a deformable washer or a spring-action clamp. Heat sinks 204, 206 and power module 202 may be interlocked with one another at step 640.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:

a power module, wherein the power module includes a first interlocking feature on a first surface of the power module; and at least one heat sink, wherein the at least one heat sink includes a second interlocking feature on a surface of the at least one heat sink, wherein the first interlocking feature includes a height greater than a depth of the second interlocking feature to a form a uniform gap between the first surface of the power module and the surface of the at least one heat sink;

wherein the surface of the at least one heat sink includes a layer of thermal interface material, wherein ideal locations for both the first interlocking feature and the second interlocking feature are determined by conducting finite element analysis, and wherein the thermal interface material includes a pattern including a dot, serpentine, or spiral.

2. The system of claim 1, wherein the power module includes the second interlocking feature on a second surface of the power module, wherein the second surface is separated from the first surface by a width of the power module.

3. The system of claim 1, wherein the first interlocking feature is a protruding interlocking feature.

4. The system of claim 1, wherein the second interlocking feature is a recessed interlocking feature.

5. The system of claim 4, wherein the recessed interlocking feature is a blind cavity.

6. The system of claim 1, wherein the layer of thermal interface material includes thermal tapes, gels, thermal epoxies, solders, grease, gap-filled pads, and phase change materials.

7. The system of claim 2, wherein the first surface and second surface include an epoxy mold compound or a copper layer.

8. The system of claim 7, wherein the first interlocking feature is located on either the epoxy mold compound or the copper layer.

9. The system of claim 1, wherein the at least one heat sink includes an inlet port or an outlet port.

10. The system of claim 4, wherein the layer of thermal interface material is uniformly extended across the surface of the at least one heat sink.

11. A method for aligning a power module and a heat sink, the method comprising:

forming a first interlocking feature on a surface of a power module;

forming a second interlocking feature on a surface of a heat sink, wherein the first interlocking feature includes a height greater than a depth of the second interlocking feature;

conducting finite element analysis to determine ideal locations for both the first interlocking feature and the second interlocking feature;

applying a layer of thermal interface material on the surface of the heat sink or power module, wherein the thermal interface material includes a pattern including a dot serpentine, or spiral; and mating the first interlocking feature with the second interlocking feature, wherein a uniform gap is formed between the surface of the power module and the surface of the heat sink, wherein the thermal interface is applied uniformly to the gap.

12. The method of claim 11, wherein forming the second interlocking feature includes machining or laser drilling into the surface of the heat sink.

13. The method of claim 11, wherein the first interlocking feature is a protruding interlocking feature.

14. The method of claim 11, wherein the second interlocking feature is a recessed interlocking feature.

15. The method of claim 11, wherein applying the layer of thermal interface material includes using solder paste, silver sinter paste, or a pump to dispense the layer of thermal interface material onto the surface of the heat sink or power module.

16. The method of claim 11, further comprising:

aligning the heat sink with the power module.

* * * * *